(12) United States Patent
Wei et al.

(10) Patent No.: US 11,764,775 B2
(45) Date of Patent: Sep. 19, 2023

(54) SWITCH DEVICE

(71) Applicant: RichWave Technology Corp., Taipei (TW)

(72) Inventors: Chun-Hao Wei, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/496,766

(22) Filed: Oct. 8, 2021

(65) Prior Publication Data
US 2023/0100893 A1 Mar. 30, 2023

(30) Foreign Application Priority Data
Sep. 28, 2021 (TW) .................................. 110136118

(51) Int. Cl.
*H03K 17/56* (2006.01)
(52) U.S. Cl.
CPC .................................... *H03K 17/56* (2013.01)
(58) Field of Classification Search
CPC ................. H03K 17/56; H03K 17/693; H03K 17/08142; H03K 17/16; H03K 17/063; H03K 17/6871; H03K 17/162; H03K 17/567; H03K 17/122; H03K 17/687; H03K 17/0822; H03K 17/08122; H03K 17/6872; H03K 2217/0036; H02M 1/32; H02M 1/0058; H02M 1/08; H02M 1/088; H02M 3/158; H03F 2200/81; H03F 3/72; H03F 3/45179; H03F 2200/249; H02H 9/046; H02H 1/0007; H02H 9/04
See application file for complete search history.

(56) References Cited

U.S. PATENT DOCUMENTS

| 4,631,470 A | 12/1986 | Bingley |
| 5,856,904 A | 1/1999 | Pelly et al. |
| 5,943,223 A | 8/1999 | Pond |

(Continued)

FOREIGN PATENT DOCUMENTS

| CN | 101227185 | 7/2008 |
| CN | 105743359 | 7/2016 |

(Continued)

OTHER PUBLICATIONS

"Office Action of Taiwan Counterpart Application", dated Mar. 8, 2022, p. 1-p. 4.

*Primary Examiner* — John W Poos
*Assistant Examiner* — Tyler J Pereny
(74) *Attorney, Agent, or Firm* — JCIPRNET

(57) ABSTRACT

The switch device includes a first circuit. The first circuit has a first end coupled between a first terminal and a second terminal, and the first circuit has the second end coupled between the first terminal and the second terminal or coupled to a third terminal. The first circuit includes a first switch and a second switch. The first switch is coupled between the first end and the second end of the first circuit and is turned on or off according to a first control signal. The second switch is connected to the first switch in parallel and is turned on or off according to a second control signal. The first switch and the second switch include transistors of the same type. In a surge protection mode, the second switch is turned on to dissipate the surge current.

20 Claims, 7 Drawing Sheets

(56) References Cited

U.S. PATENT DOCUMENTS

| | | | |
|---|---|---|---|
| 7,265,604 B2* | 9/2007 | Yasuda | H03K 17/693 333/81 R |
| 11,050,245 B2* | 6/2021 | Chao | H03K 17/693 |
| 2003/0117206 A1 | 6/2003 | Ohnakado | |
| 2004/0211677 A1 | 10/2004 | Lewis | |
| 2006/0194558 A1* | 8/2006 | Kelly | H03K 17/693 455/319 |
| 2010/0225378 A1 | 9/2010 | Nakatsuka et al. | |
| 2016/0015617 A1 | 1/2016 | Pawelek | |
| 2017/0278840 A1 | 9/2017 | Robbins et al. | |
| 2018/0287376 A1* | 10/2018 | de Raad | H01L 27/0629 |
| 2019/0140687 A1 | 5/2019 | Tombak et al. | |
| 2019/0305768 A1 | 10/2019 | Willard et al. | |
| 2020/0028357 A1* | 1/2020 | Chen | H05K 1/0259 |

FOREIGN PATENT DOCUMENTS

| | | |
|---|---|---|
| CN | 109039048 | 12/2018 |
| EP | 2412208 | 2/2012 |
| TW | 477114 | 2/2002 |
| TW | 201528684 | 7/2015 |
| WO | 2011034140 | 3/2011 |

* cited by examiner

SWITCH DEVICE

CROSS-REFERENCE TO RELATED APPLICATION

This application claims the priority benefit of Taiwan application serial no. 110136118, filed on Sep. 28, 2021. The entirety of the above-mentioned patent application is hereby incorporated by reference herein and made a part of this specification.

BACKGROUND

Technical Field

The disclosure relates to a switch device, and more particularly to a switch device with improved switching speed.

Description of Related Art

Conventionally, a large-sized transistor may be disposed in a shunt circuit to effectively discharge the electrostatic discharge current, so as to provide a switch device with an increased ability to withdraw electrostatic discharges.

However, the large-sized transistor disposed in the shunt circuit may result in large-sized parasitic capacitance during the switching process of the switch, which may reduce the switching speed of the switch device and affect the performance of the signal transmitting.

SUMMARY

The disclosure provides a switch device with improved switching speed and/or increased ability to dissipate a surge current in a surge protection mode.

The switch device according to the disclosure includes a first circuit. The first circuit has a first end coupled between a first terminal and a second terminal. The first circuit has a second end coupled between the first terminal and the second terminal or coupled to a third terminal. The first circuit includes a first switch and a second switch. The first switch is coupled between the first end of the first circuit and the second end of the first circuit, and the first switch is turned on or off according to a first control signal. The second switch is connected in parallel with the first switch and is turned on or off according to a second control signal. The first switch and the second switch include transistors of the same type. In a surge protection mode, the second switch is turned on to dissipate a surge current.

DESCRIPTION OF THE EMBODIMENTS

Figure 1:
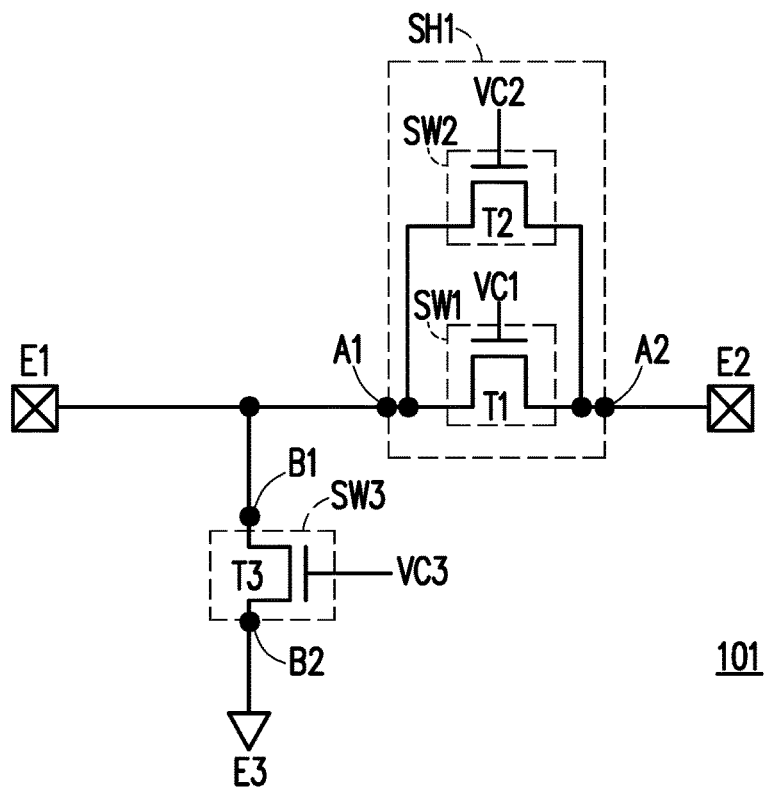
FIG. 1 is a schematic view of a switch device according to an embodiment of the disclosure.
Figure 2:
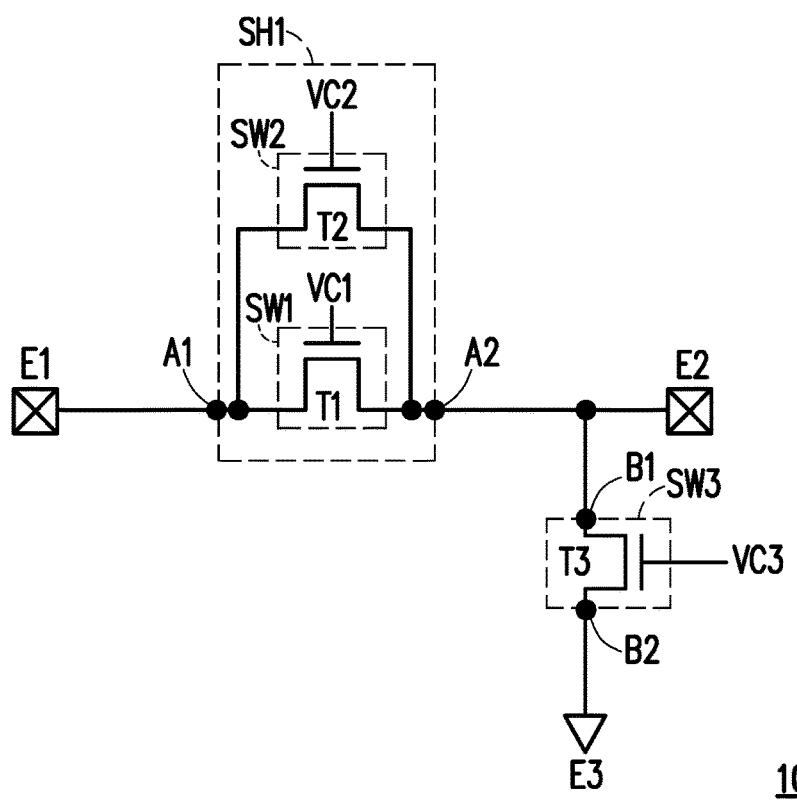
FIG. 2 is a schematic view of a switch device according to another embodiment of the disclosure.

Referring to FIG. 1 and FIG. 2, FIG. 1 and FIG. 2 are schematic views of switch devices 101 and 102 according to an embodiment of the disclosure.

In an embodiment, as shown in FIG. 1, the switch device 101 includes a first circuit SH1 and a switch SW3. A first end A1 and a second end A2 of the first circuit SH1 are coupled to a current path formed between a first terminal E1 and a second terminal E2. In the embodiment, the first end A1 of the first circuit SH1 is coupled to the first terminal E1, and the second end A2 is coupled to the second terminal E2. In the embodiment, a first end B1 of the switch SW3 is coupled to the first terminal E1 and the first end A1 of the first circuit SH1, and a second end B2 of the switch SW3 is coupled to a third terminal E3. In another embodiment, as shown in FIG. 2, the first end B1 of the switch SW3 may also be coupled to the second end A2 of the first circuit SH1 and the second terminal E2. In the embodiment, the switch SW3 is turned on or off according to a control signal VC3. In a further embodiment, the switch SW3 may include a transistor T3, and the control end of the transistor T3 is configured to receive the control signal VC3.

Accordingly, the first circuit SH1 may be used to switch the signal transmission between the first terminal E1 and the second terminal E2, and the switch SW3 may be used for shunt. For example, when the first circuit SH1 is turned off so that the signal is not transmitted between the first terminal E1 and the second terminal E2, the switch SW3 is turned on for shunting. However, the disclosure is not limited thereto. In other embodiments, the switch SW3 may be used to switch signal transmission between the first terminal E1 and the second terminal E2, and the first circuit SH1 may be a first shunt circuit and may be used for shunting when turned on.

Figure 3:
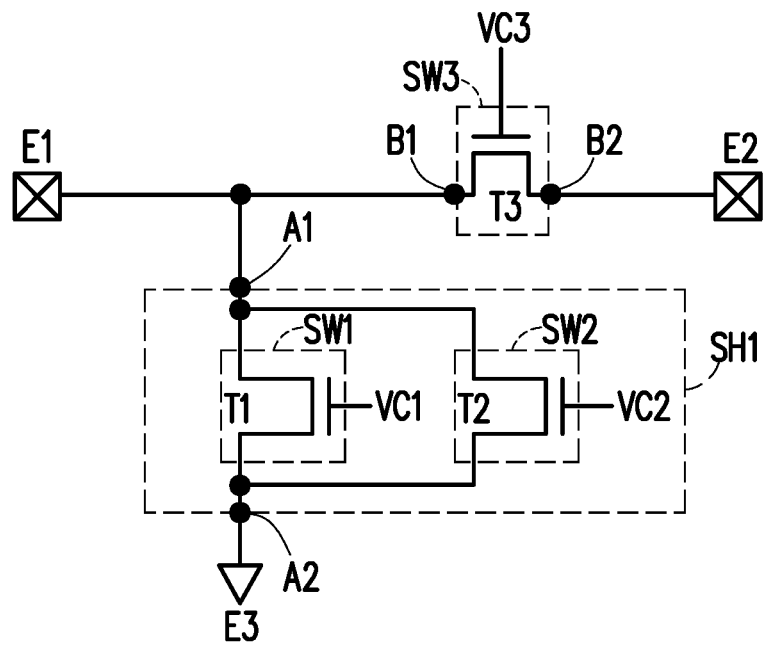
FIG. 3 is a schematic view of a switch device according to another embodiment of the disclosure.
Figure 4:
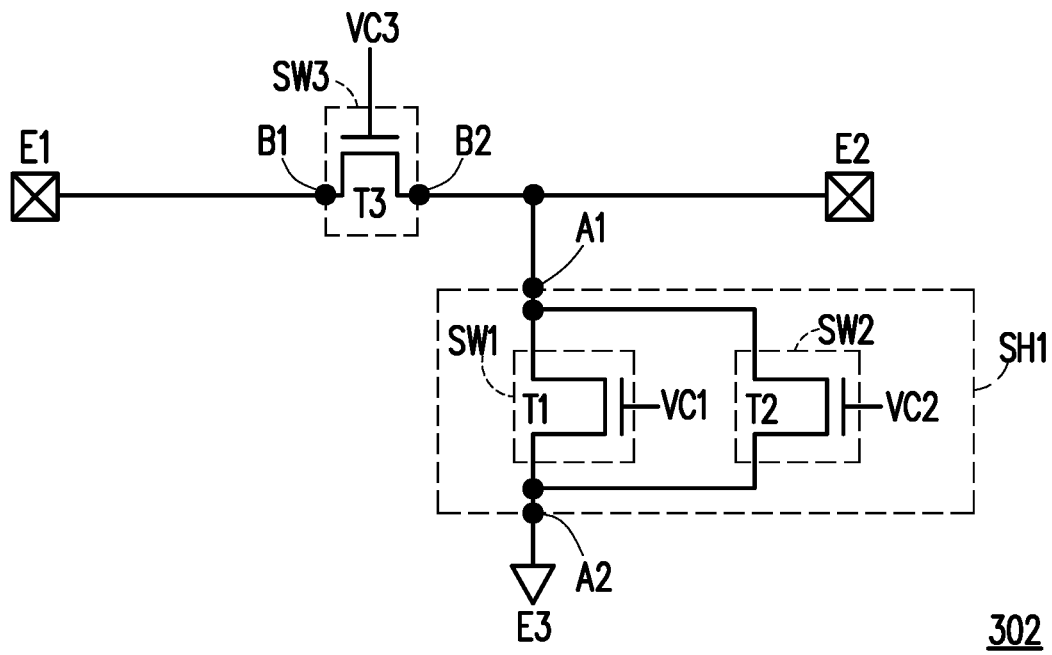
FIG. 4 is a schematic view of a switch device according to another embodiment of the disclosure.

Referring to FIG. 3 and FIG. 4, FIG. 3 and FIG. 4 are schematic views of a switch device according to another embodiment of the disclosure. A switch device 301 includes the first shunt circuit SH1 and the switch SW3. The first end B1 of the switch SW3 is coupled to the first terminal E1, and the second end B2 is coupled to the second terminal E2. In the embodiment, the first end A1 of the first shunt circuit SH1 is coupled to the first terminal E1 and the first end B1 of the switch SW3 (as shown in FIG. 3), or the first end A1 of the first shunt circuit SH1 is coupled to the second terminal E2 and the second end B2 of the switch SW3 (as shown in FIG. 4).

In an embodiment, the first terminal E1 and the second terminal E2 may be signal transceivers for receiving or transmitting signals. The third terminal E3 may be a reference voltage terminal for receiving a reference voltage, such as a ground voltage.

In an embodiment, referring to FIG. 1 to FIG. 4, the first circuit SH1 includes a switch SW1 and a switch SW2. The first end of the switch SW1 is coupled to the first end A1 of the first circuit SH1, and the second end of the switch SW1 is coupled to the second end A2 of the first circuit SH1. The switch SW2 is coupled to the switch SW1 in parallel. The switches SW1 and SW2 are turned on or off according to control signals VC1 and VC2, respectively. Furthermore, the switches SW1 and SW2 may include transistors T1 and T2, respectively. The first ends of the transistors T1 and T2 are coupled to each other, and the second ends of the transistors T1 and T2 are coupled to each other. The control ends of the transistors T1 and T2 receive the control signals VC1 and VC2, respectively. In one embodiment, the transistors T1 and T2 are of the same type. For example, both the transistors T1 and T2 may be N-type transistors or P-type transistors. For example, when both are N-type transistors, the first ends of the transistors T1 to T2 are drains, the second ends are sources, and the control ends are gates. In the embodiment, by using the same type of transistors T1 and T2, the switching speed may be improved without additional manufacturing process or significant increase in cost.

In an embodiment, in the normal mode of signal transmission, the conduction states of the switch SW1 and the switch SW3 may be different. For example, when the switch SW1 is turned on, the switch SW3 may be turned off, and when the switch SW1 is turned off, the switch SW3 may be turned on. Furthermore, in the normal mode, the switches SW1 and SW3 may be switched between on and off according to the control signals VC1 and VC3, respectively. As shown in FIG. 1 to FIG. 2, when the switch SW1 is turned on, signals may be transmitted between the first terminal E1 and the second terminal E2, and when the switch SW1 is turned off, the switch SW3 may be turned on for shunting. Alternatively, as shown in FIG. 3 to FIG. 4, when the switch SW3 is turned on, signals may be transmitted between the first terminal E1 and the third terminal E3. When the switch SW3 is turned off, the switch SW1 is turned on so that the first shunt circuit SH1 may be turned on for shunting, such as to divert currents.

In an embodiment, when the switch device 101 or 102 receives a surge voltage or a surge current, such as an electrostatic discharge, the switch device 101 or 102 may enter a surge protection mode. In the surge protection mode, the switch SW2 may be turned on according to the control signal VC2 to assist in dissipating the surge current. Furthermore, in the surge protection mode, the switch SW1 and the switch SW3 may also be turned on to dissipate the surge current. Furthermore, in the surge protection mode, the transistor T1 of the switch SW1, the transistor T2 of the switch SW2, and the transistor T3 of the switch SW3 may all be turned on to dissipate the surge current. In the embodiment, compared to a circuit with only the switches SW1 and SW3, the additional transistor T2 of the switch SW2 may increase the ability to dissipate the surge current in the surge protection mode.

Specifically, in a first embodiment, the transistor T2 of the switch SW2 may maintain turned-off in the normal mode (not shown), while the transistors T1 and T3 may be switched between on and off for switching signal transmissions. In the embodiment, the size of the transistor T2 may be greater than, less than, or equal to the size of the transistor T1 so as to assist in dissipating the surge current. Alternatively, in a second embodiment, the transistor T2 is switched between on and off in the normal mode, and the size of the transistor T2 may be less than the size of the transistor T1, so as to improve the switching speed of the transistor T1. Note that in the first and second embodiments, as described, when, for example, an electrostatic discharge occurs, the switch device enters the surge protection mode, and the transistor T2 is turned on.

Taking FIG. 3 as an example, the operation of the transistor T2 in the second embodiment is further illustrated below.

Figure 5A:
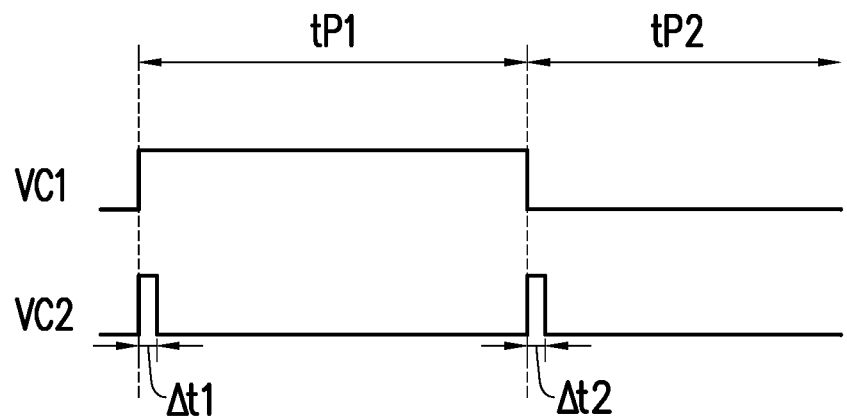
FIG. 5A is a waveform diagram illustrating an implementation of control signals of a first shunt circuit in a switch device according to an embodiment of the disclosure.
Figure 5B:
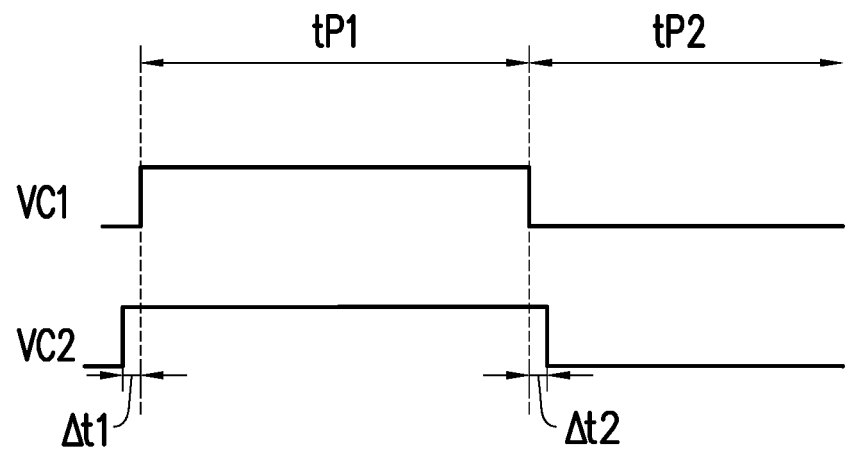
FIG. 5B is a waveform diagram illustrating another implementation of control signals of a first shunt circuit in a switch device according to an embodiment of the disclosure.

Referring to FIG. 3, FIG. 5A, and FIG. 5B together, FIG. 5A and FIG. 5B are waveform diagrams illustrating an implementation of the control signals VC1 and VC2 of the first shunt circuit SH1 in a switch device according to an embodiment of the disclosure.

In FIG. 5A, during a first period tP1, the transistor T1 may be maintained turned-on according to the control signal VC1 having a relatively high level, and during the second period tP2, the transistor T1 may be maintained turned-off according to the control signal VC1 having a relatively low level. At the beginning of the first period tP1, the transistor T1 is changed from off to on, and the transistor T2 may be turned on according to a high voltage pulse of the control signal VC2 and may stay turned-on for a voltage setting period $\Delta t1$ At the beginning of the second period tP2, the transistor T1 is changed from on to off, and the transistor T2 may be turned on according to another high voltage pulse of the control signal VC2 and may stay turned-on for another voltage setting period $\Delta t2$. During the voltage setting periods $\Delta t1$ and $\Delta t2$, the transistor T2 is turned on so that the two ends of the transistor T1 are set to a same voltage value. In the embodiment, since the size of the transistor T2 is less than the size of the transistor T1, the transistor T2 may have a faster switching speed than the transistor T1. Through the rapid switch action to ON of the transistor T2, the two ends of the transistor T1 are set to a same voltage value, so that the gate-source voltage and the gate-drain voltage of the transistor T1 may reach desired value(s) quickly, and thereby the transistor T1 may quickly enter an on state or an off state. Therefore, by using the transistor T2, the switching speed of the transistor T1 between on and off may be increased.

In FIG. 5B, the operation of the transistor T1 is similar to that illustrated in FIG. 5A, which may be not repeated. The difference is that the voltage setting period $\Delta t1$, during which the control signal VC2 may be pulled high and maintained high so as to turn on the transistor T2 and maintain transistor T2 on, starts before the beginning of the first period tP1 by a time length $\Delta t1$. Then, during the first period tP1, the voltage value of the control signal VC2 maintains a high level so that the transistor T2 is maintained on. At the beginning of the second period tP2, the transistor T1 is changed from on to off while the transistor T2 is maintained on continuously for another voltage setting period $\Delta t2$. That is, during the voltage setting period $\Delta t2$, the voltage value of the control signal VC2 is maintained at a high level to keep the transistor T2 turned on until the voltage setting period $\Delta t2$ ends. Then, when the voltage setting period $\Delta t2$ ends, the voltage value of the control signal VC2 is pulled down so that the transistor T2 is turned off. During the voltage setting periods $\Delta t1$ and $\Delta t2$, the transistor T2 is maintained turned-on so that two ends of the transistor T1 are set to a same voltage value. Referring to FIG. 3, during the first period tP1, the transistors T1 and T2 may both be turned on and used to divert currents (that is, shunt) synchronously. In the embodiment as shown in FIG. 5B, the beginning of the voltage setting period Δt1 is earlier than the beginning of the first period tP1, and the beginning of the voltage setting period Δt2 coincides with the beginning of the second period tP2.

FIG. 5A and FIG. 5B illustrate the transistors T1 and T2 in the normal mode in the second embodiment. During the first period tP1 and/or the second period tP2, electrostatic discharges may occur, the switch device may enter the surge protection mode, and transistors T1, T2, and T3 may all be turned on to dissipate the surge current.

In the above embodiments, the time length of the voltage setting period Δt1 is less than the time length of the first period tP1, and the time length of the voltage setting period Δt2 is less than the time length of the second period tP2. In a further embodiment, the transistor T2 may be turned on during one of the voltage setting periods Δt1 and Δt2, and not both as above described. However, that is not limited in the disclosure.

Figure 6A:
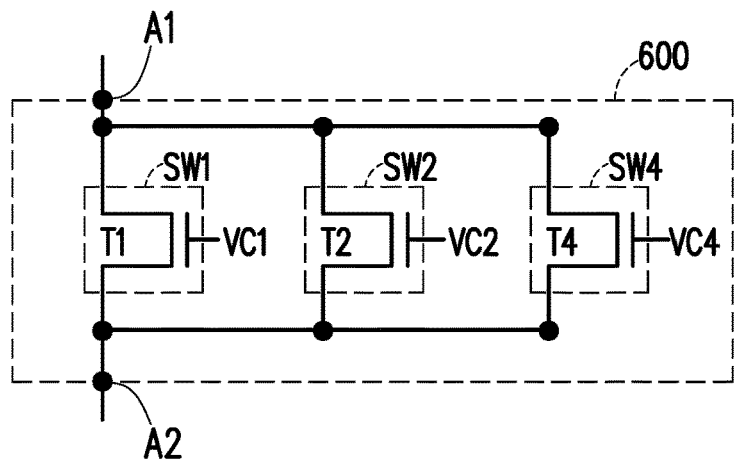
FIG. 6A is a schematic view illustrating an implementation of a first shunt circuit in a switch device according to an embodiment of the disclosure.
Figure 6B:
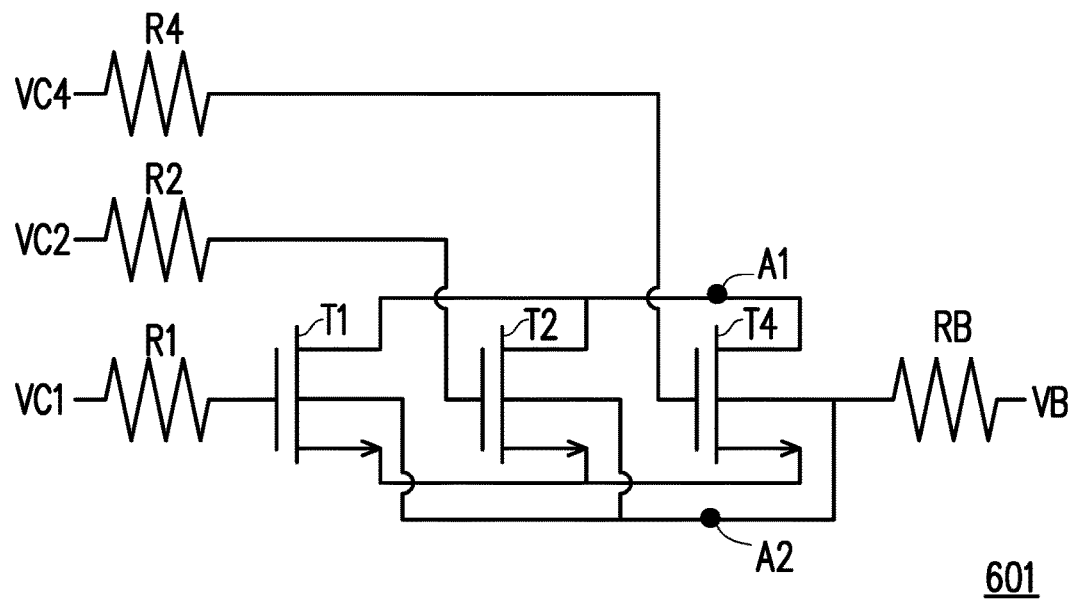
FIG. 6B and FIG. 6C respectively are schematic views illustrating other implementations of a first shunt circuit in a switch device according to an embodiment of the disclosure.
Figure 6C:
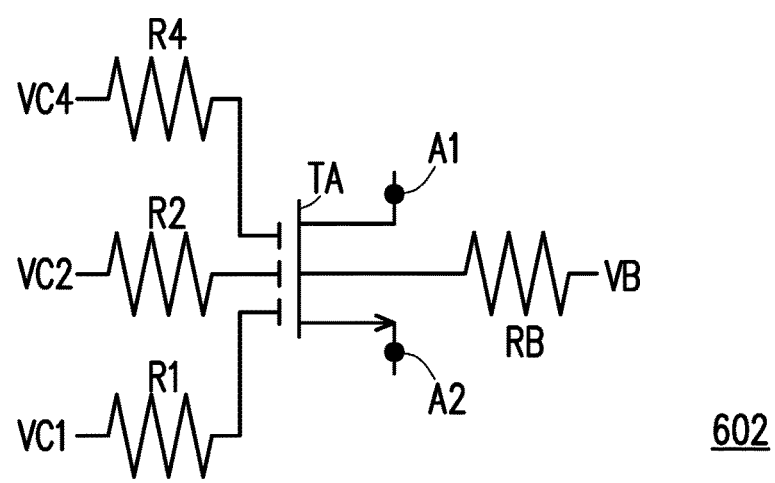

Referring to FIG. 6A to FIG. 6C, FIG. 6A to FIG. 6C are schematic views of implementations of a first shunt circuit 600 in a switch device according to an embodiment of the disclosure. The first shunt circuit 600 includes switches SW1, SW2, and SW4. The switches SW1, SW2, and SW4 are connected in parallel between the first end A1 and the second end A2 of the first shunt circuit 600. The switches SW1, SW2, and SW4 may include transistors T1, T2, and T4, respectively. The first ends of the transistors T1, T2, and T4 are commonly coupled to the first end A1 of the first shunt circuit 600, the second ends of the transistors T1, T2, and T4 are commonly coupled to the second end A2 of the first shunt circuit 600, and the control ends of the transistors T1, T2, and T4 receive control signals VC1, VC2, and VC4, respectively. The transistors T1, T2, and T4 are turned on or off according to the control signals VC1, VC2, and VC4, respectively.

Specifically, in a third embodiment, in the normal mode, the transistor T1 may be switched between on and off to switch signal transmission, the transistor T2 may be switched between on and off to improve the switching speed of the transistor T1, and the transistor T4 may be maintained turned-off (not shown). When, for example, an electrostatic discharge occurs and the switch device enters the surge protection mode, the transistor T4 is turned on to dissipate the surge current. Furthermore, in the surge protection mode, the transistors T1-T4 may all be turned on to dissipate the surge current. In the embodiment, the size of the transistor T2 may be less than the size of the transistor T1.

Figure 7A:
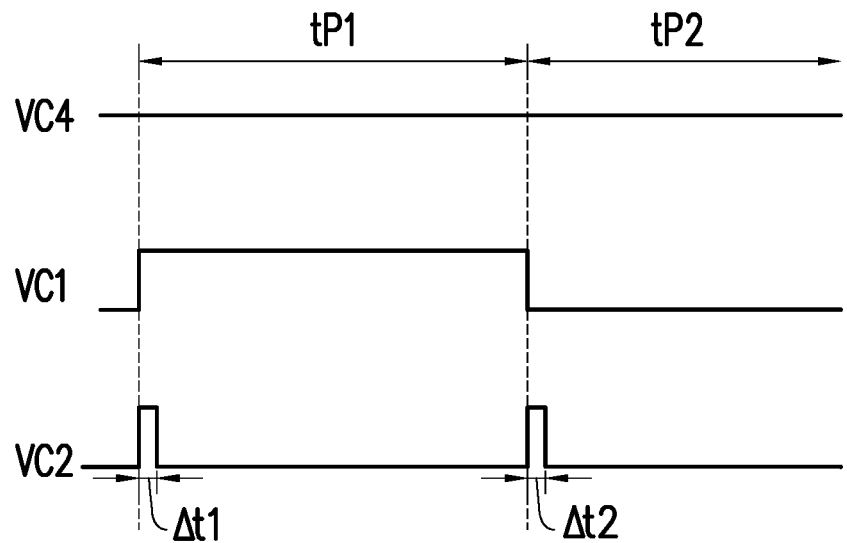
FIG. 7A is a waveform diagram illustrating an operation of the implementation of the first shunt circuit of FIG. 6A.
Figure 7B:
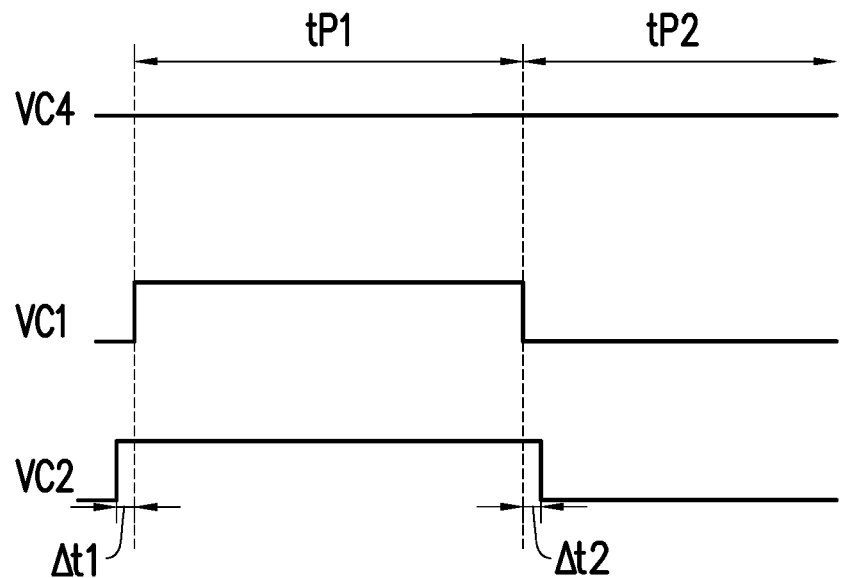
FIG. 7B is a waveform diagram illustrating another operation of the implementation of the first shunt circuit of FIG. 6A.

For the details of the operation, refer to FIG. 6A, FIG. 7A, and FIG. 7B together. FIGS. 7A and 7B are waveform diagrams illustrating an operation of the implementation of the first shunt circuit 600 of FIG. 6A. In the embodiment, in the normal mode, the sequential operations of the transistors T1 and T2 are similar to those in FIG. 5A and FIG. 5B, which is not repeated herein. The difference is that compared to FIG. 5A and FIG. 5B, the switch SW4 is further disposed, which includes the transistor T4. In the normal mode as shown in FIG. 7A and FIG. 7B, in either the first period tP1 or the second period tP2, the transistor T4 is maintained in an off state according to the control signal VC4 having a constant low voltage. On the other hand, during the first period tP1 and/or the second period tP2, an electrostatic discharge may occur, the switch device may enter the surge protection mode, and transistors T1, T2, and T4 three may all be turned on to dissipate the surge current.

In some embodiments, the size of the transistor T2 may be less than the size of the transistor T1, and therefore the transistor T2 may have a faster switching speed than the transistor T1. Through the rapid switch action to ON of the transistor T2, the transistor T1 may quickly enter an on or off state. Therefore, by using the transistor T2, the switching speed of the transistor T1 between on and off may be increased. In yet another embodiment, the size of the transistor T4 may be greater than the size of the transistor T1, and therefore in the surge protection mode, the transistor T4 may have a stronger ability to divert currents, and thereby the reliability of the switch device is improved. However, the disclosure is not limited thereto. In other embodiments, the size of the transistor T4 may also be selected to be equal to or less than the size of the transistor T1 depending on factors such as the space size. In this case, since the transistors T1, T2, and T4 may all be turned on in the surge protection mode, the transistor T4 may function as an assist in diverting currents without significant cost increases.

Referring to FIG. 6B and FIG. 6C, FIG. 6B and FIG. 6C respectively are schematic views illustrating other implementations of the first shunt circuit 600 in a switch device according to an embodiment of the disclosure.

In FIG. 6B, a first shunt circuit 601 includes the transistors T1, T2, and T4 and resistors R1, R2, and R4. The first ends of the transistors T1, T2, and T4 are coupled to the first end A1 of the first shunt circuit, and the second ends of the transistors T1, T2, and T4 are coupled to the second end A2 of the first shunt circuit. The control ends of the transistors T1, T2, and T4 are respectively coupled to one end of the resistors R1, R2, and R4. The other end of the resistors R1, R2, and R4 may configured to receive the control signals VC1, VC2, and VC4, respectively. Moreover, the transistors T1, T2, and T4 may have separate substrates, and the substrates are coupled to one another via wires. The separate substrates of the transistors T1, T2, and T4 may all receive a substrate voltage VB via a common resistor RB.

In FIG. 6C, the transistors T1, T2, and T4 may share the same substrate. For example, the first shunt circuit 602 may include a multi-gate transistor TA. The multiple gates of the multi-gate transistor TA are respectively coupled to the resistors R1, R2, and R4 and respectively receive the control signals VC1, VC2, and VC4 via the resistors R1, R2, and R4. The first end of the multi-gate transistor TA is coupled to the first end A1 of the first shunt circuit 602, and the second end of the multi-gate transistor TA is coupled to the second end A2 of the first shunt circuit 602. The substrate of the multi-gate transistor TA receives the substrate voltage VB via the resistor RB.

Figure 8A:
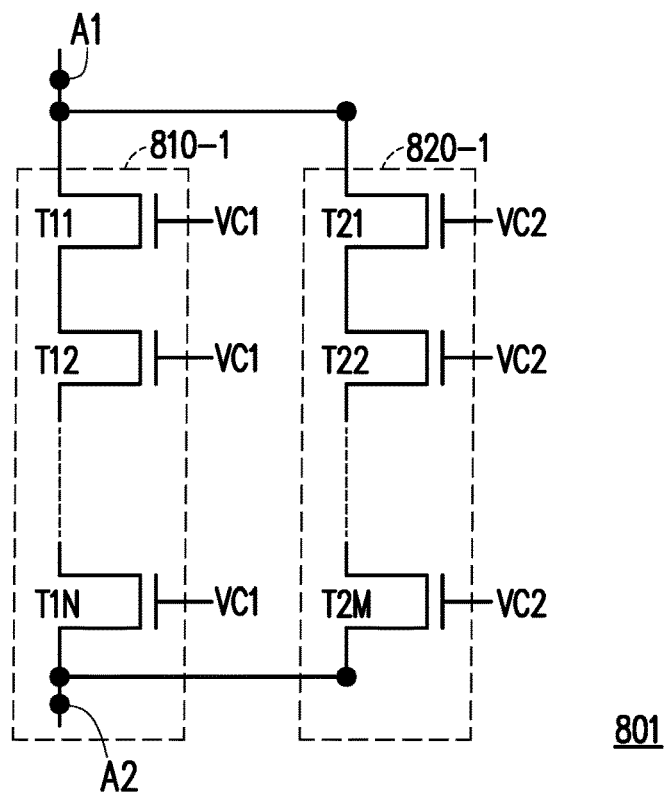
FIG. 8A and FIG. 8B respectively are schematic views illustrating other implementations of a first shunt circuit in a switch device according to an embodiment of the disclosure.
Figure 8B:
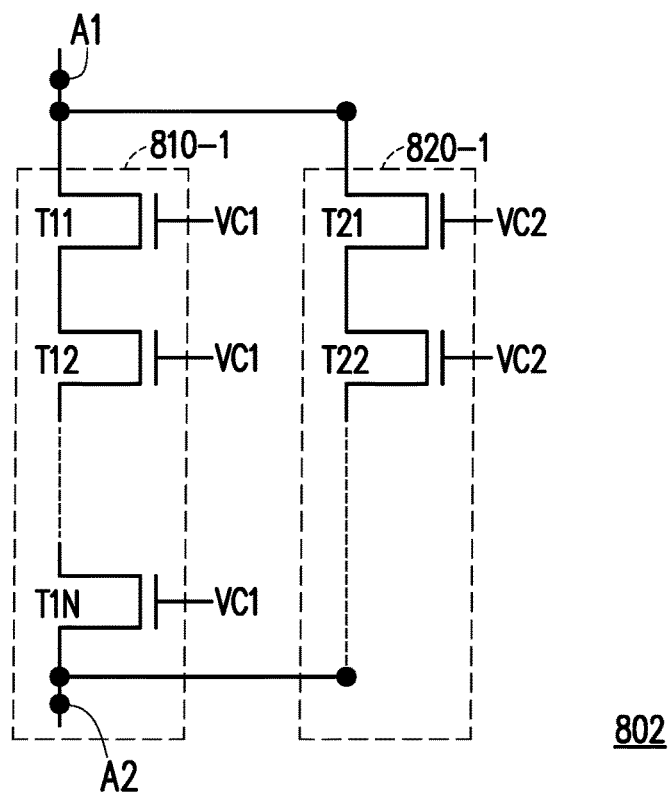

In some embodiments, the transistors T1, T2, and T4 may all be N-type transistors, or all P-type transistors. For example, when all are N-type transistors, the first ends of the transistors T1, T2, and T4 may be drains, the second ends may be sources, and the control ends may be gates. Referring to FIG. 8A and FIG. 8B, FIG. 8A and FIG. 8B are schematic views illustrating other implementations of shunt circuits 801 and 802 respectively in a switch device according to an embodiment of the disclosure.

In FIG. 8A, the shunt circuit 801 includes a switch 810-1 and a switch 820-1, and the switch 810-1 and the switch 820-1 are coupled in parallel with each other. Furthermore, the switch 810-1 includes a plurality of transistors T11 to T1N, and the switch 820-1 includes a plurality of transistors T21 to T2M, where N and M are integers greater than 1. In the switch 810-1, the transistors T11 to T1N are serially connected between the first end A1 and the second end A2 in sequence. In the switch 820-1, the transistors T21 to T2M are serially connected between the first end A1 and the second end A2 in sequence. In the embodiment, the number of transistors T11 to T1N may be equal to the number of transistors T21 to T2M, that is, N=M. However, the disclosure is not limited thereto. In other embodiments, N may be different from M. For example, in FIG. 8B, the switch 810-2 includes transistors T11 to T13, and the switch 820-2 includes transistors T21 and T22. That is, N=3, and M=2.

In some embodiments, the control ends of the transistors T11 to T1N may all receive the same control signal VC1 and may be turned on or turned off synchronously accordingly. The control ends of the transistors T21 to T2M may all receive another same control signal VC2 and may be turned on or turned off synchronously accordingly. In the embodiment, the turn-on and turn-off actions of the switch 810-1 are similar to those actions of the switch SW1 in the embodiments of FIG. 1 to FIG. 4, and the turn-on and turn-off actions of the switch 820-1 are similar to those actions of the switch SW2 in the embodiments of FIG. 1 to FIG. 4, which is not repeated herein. In the embodiment, the transistors T11 to T1N may be transistors of the same type, for example, N-type transistors. The transistors T21 to T2M may be transistors of the same type, for example, N-type transistors.

Figure 9:
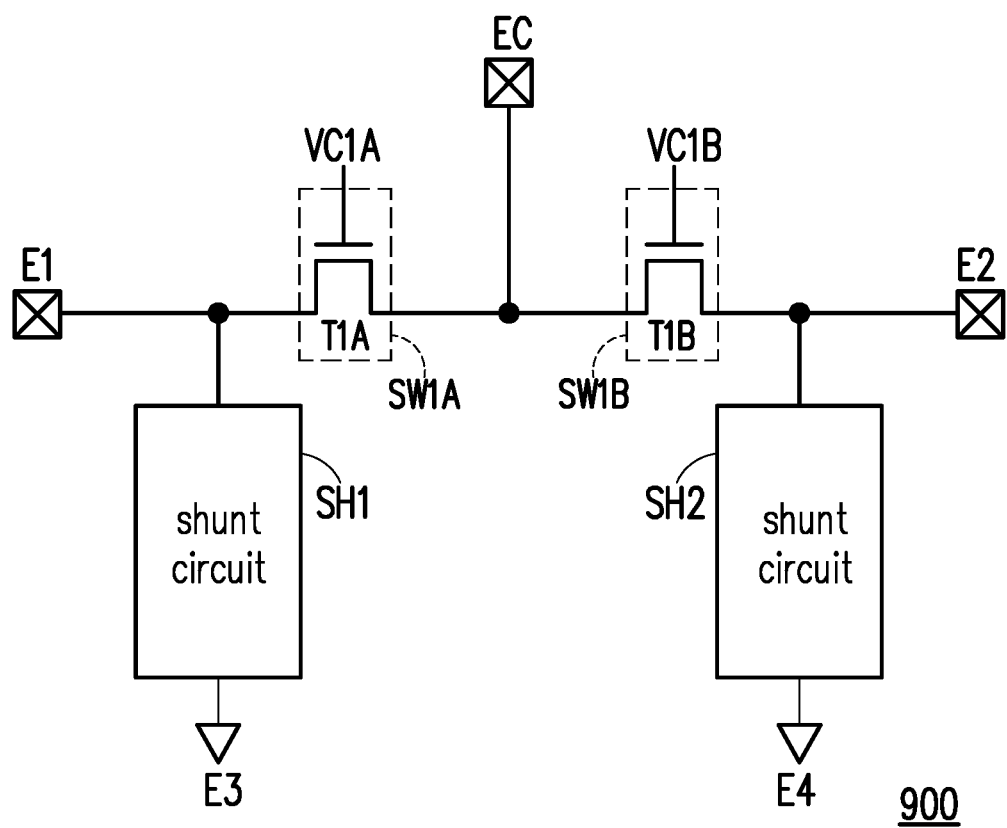
FIG. 9 is a schematic view of a switch device according to another embodiment of the disclosure.

Referring to FIG. 9, FIG. 9 is a schematic view of a switch device according to another embodiment of the disclosure. A switch device 900 includes the shunt circuits SH1 and SH2, switch SW1A, and switch SW1B. One end of the shunt circuit SH1 is coupled to the first terminal E1, and another end is coupled to the third terminal E3. One end of the switch SW1A is coupled to the first terminal E1, and another end is coupled to the common terminal EC. One end of the switch SW1B is coupled to the common terminal EC, and another end is coupled to the second terminal E2. One end of the shunt circuit SH2 is coupled to the second terminal E2, and another end is coupled to a fourth terminal E4. The shunt circuits SH1 and SH2 may be implemented as any shunt circuit in the foregoing embodiments. The circuit structures of the shunt circuits SH1 and SH2 may be identical or different, which is not limited in the disclosure.

In the embodiment, the first terminal E1, the second terminal E2, and the common terminal EC are signal transceivers, and the third terminal E3 and the fourth terminal E4 are reference voltage terminals, such as ground. Furthermore, the switch SW1A may include a transistor T1A, and the switch SW1B may include a transistor T1B. The switches SW1A and SW1B are turned on or off according to the control signals VC1A and VC1B, respectively.

In the normal mode, the on or off states of the switches SW1A and SW1B may be different. For example, in the normal mode, when the switch SW1A is turned on and the shunt circuit SH1 does not divert currents, the switch SW1B may be turned off and the shunt circuit SH2 is activated to divert currents. Alternatively, when the switch SW1A is turned off and the shunt circuit SH1 is activated to divert currents, the switch SW1B may be turned on, and the shunt circuit SH2 does not divert currents.

In the surge protection mode, at least one of the shunt circuits SH1 and SH2 may be activated to dissipate the surge current. Furthermore, at least one of the switches SW1A and SW1B may be turned on and used to dissipate the surge current.

In summary, a first switch and a second switch are disposed in the switch device of the disclosure. In the normal mode, the first switch may be used to switch signal transmission, and the second switch may be used to improve the switching speed of the first switch. In the surge protection mode, the second switch may be used to assist in dissipating the surge current. Furthermore, in the disclosure, a first switch, a second switch, and a fourth switch are disposed in the switch device. In the normal mode, the first switch may be used to switch signal transmission, the second switch may be used to improve the switching speed of the first switch, and the fourth switch is maintained turned-off. In the surge protection mode, the second switch and the fourth switch may be used to assist in dissipating the surge current. The switch device of the disclosure may increase the switching speed of the switch device and/or may increase the ability to dissipate the surge current.

What is claimed is:
1. A switch device comprising:
a first circuit, wherein a first end of the first circuit is coupled between a first terminal and a second terminal, a second end of the first circuit is coupled between the first terminal and the second terminal or the second end of the first circuit is coupled to a third terminal, and wherein the first circuit comprises:
a first switch, wherein a first end of the first switch is coupled to the first end of the first circuit, a second end of the first switch is coupled to the second end of the first circuit, and the first switch is turned on or off according to a first control signal; and
a second switch, connected in parallel with the first switch, wherein the second switch is turned on or off according to a second control signal,
wherein the first switch and the second switch comprise transistors of a same type,
wherein in a normal mode, the first switch is configured to transmit a RF signal when turned on according to the first control signal, and
wherein in a surge protection mode, the second switch is turned on to dissipate a surge current,
wherein in the normal mode, the first switch is switched between on and off, the second switch is switched between on and off to adjust a switching speed of the first switch.

2. The switch device according to claim 1, wherein
the first end of the first circuit is coupled to the first terminal, and the second end of the first circuit is coupled to the second terminal,
wherein the switch device further comprises:
a third switch, wherein a first end of the third switch is coupled to the first terminal or the second terminal, the second end of the third switch is coupled to the third terminal, and the third switch is turned on or off according to a third control signal,
wherein the first terminal and the second terminal are signal transceivers, the third terminal is a reference voltage terminal, and in the normal mode, the conduction states of the third switch and the first switch are different.

3. The switch device according to claim 1, wherein
the first end of the first circuit is coupled between the first terminal and the second terminal, and the second end of the first circuit is coupled to the third terminal;
wherein the switch device further comprises:
a third switch, wherein the first end of the third switch is coupled to the first terminal, the second end of the third switch is coupled to the second terminal, and the third switch is turned on or off according to a third control signal,
wherein the first terminal and the second terminal are signal transceivers, the third terminal is a reference voltage terminal, and in the normal mode, the conduction states of the third switch and the first switch are different.

4. The switch device according to claim 3, wherein in the normal mode, when the first switch is turned on, the third switch is turned off, and when the first switch is turned off, the third switch is turned on.

5. The switch device according to claim 3, wherein the first switch comprises a first transistor, the second switch comprises a second transistor,
wherein a first end of the first transistor is coupled to a first end of the second transistor, a second end of the first transistor is coupled to a second end of the second transistor, a control end of the first transistor and a control end of the second transistor respectively receive the first control signal and the second control signal, and the first transistor and the second transistor are transistor of the same type,
wherein the third switch comprises a third transistor,
wherein the first circuit is a first shunt circuit.

6. The switch device according to claim 5, wherein when the first transistor is switched between on and off, the second transistor is turned on to set voltages on the first end and the second end of the first transistor, wherein a size of the second transistor is less than a size of the first transistor.

7. The switch device according to claim 6, wherein in the normal mode, the first transistor is maintained turned-on for a first period and turned-off for a second period, the second transistor is turned on for at least one voltage setting period, and the at least one voltage setting period is at the beginning of the first period and/or the second period, and a time length of the at least voltage setting period is less than a time length of the first period and/or the second period.

8. The switch device according to claim 7, wherein the beginning of the at least one voltage setting period for the second transistor is earlier than the beginning of the first period and/or the beginning of the second period, or wherein
the beginning of the at least one voltage setting period coincides the beginning of the first period and/or the beginning of the second period.

9. The switch device according to claim 5, wherein in the normal mode, the second transistor is maintained turned-off.

10. The switch device according to claim 6, wherein the first shunt circuit further comprises:
a fourth switch, wherein the fourth switch comprises a fourth transistor, a first end of the fourth transistor is coupled to the first end of the first transistor, a second end of the fourth transistor is coupled to the second end of the first transistor a control end of the fourth transistor receives a fourth control signal, and the fourth transistor is turned on or off according to the fourth control signal,
wherein in the normal mode, when the first transistor is switched between on and off, the third transistor is maintained turned-off.

11. The switch device according to claim 10, wherein in the normal mode, the first transistor is maintained turned-on for a first period and maintained turned-off for a second period,
wherein the second transistor is turned on for at least one voltage setting period, and the at least one voltage setting period is at beginnings of the first period and/or the second period, and a time length of the at least one voltage setting period is less than a time length of the first period and/or the second period,
wherein the beginning of the at least one voltage setting period is earlier than the beginning of the first period and/or the beginning of the second period, or wherein
the beginning of the at least one voltage setting period coincides the beginning of the first period and/or the beginning of the second period.

12. The switch device according to claim 10, wherein the fourth transistor and the first transistor are transistor of the same type.

13. The switch device according to claim 12, wherein the first transistor, the second transistor, and the fourth transistor are P-type transistors or N-type transistors, wherein
the first ends of the first transistor, the second transistor, and the fourth transistor respectively are drains, the second ends of the first transistor, the second transistor, and the fourth transistor are sources, and the control ends of the first transistor, the second transistor, and the fourth transistor are gates, respectively.

14. The switch device according to claim 13, wherein a substrate of the first transistor, a substrate of the second transistor, and a substrate of the fourth transistor are coupled to one another, or wherein
the first transistor, the second transistor, and the fourth transistors share a same substrate.

15. The switch device according to claim 1, wherein in the surge protection mode, both the first switch and the second switch are turned on to dissipate the surge current together.

16. The switch device according to claim 5, wherein the first transistor receives the first control signal via a first resistor, and the second transistor receives the second control signal via a second resistor.

17. The switch device according to claim 10, wherein the fourth switch receives the fourth control signal via a resistor.

18. The switch device according to claim 3, the first switch comprises a plurality of first transistors connected in series, the second switch comprises a plurality of second transistors connected in series, and the number of the second transistors is less than or equal to the number of the first transistors.

19. The switch device according to claim 18, wherein each of the plurality of first transistors is coupled in parallel with one of the plurality of second transistors and is aligned with the one of the plurality of second transistors.

20. The switch device according to claim 10, further comprising:
a fifth switch coupled between a common terminal and the second terminal, wherein the common terminal is coupled between the first terminal and the second terminal; and
a second shunt circuit, wherein a first end of the second shunt circuit is coupled to the second terminal, and a second end of the second shunt circuit is coupled to a fourth terminal, wherein the fourth terminal is a second reference voltage terminal.

* * * * *